United States Patent
Lehtonen et al.

(10) Patent No.: US 7,481,849 B2
(45) Date of Patent: Jan. 27, 2009

(54) PROTECTION OF AN INMOULDED ELECTRIC APPLIANCE AGAINST EXPLOSION

(75) Inventors: Mikko Lehtonen, Lohja (FI); Marko Hagström, Salo (FI)

(73) Assignee: Salcomp Oy, Kemijarui (FI)

( * ) Notice: Subject to any disclaimer, the term of this patent is extended or adjusted under 35 U.S.C. 154(b) by 345 days.

(21) Appl. No.: 11/408,872

(22) Filed: Apr. 20, 2006

(65) Prior Publication Data
US 2006/0254036 A1 Nov. 16, 2006

(30) Foreign Application Priority Data
Apr. 29, 2005 (FI) .................. 20050462

(51) Int. Cl.
*H01G 9/00* (2006.01)
(52) U.S. Cl. ............ 29/25.03; 361/520; 361/521; 361/523; 361/531; 361/534; 257/E21.008
(58) Field of Classification Search .......... 361/505, 361/520, 521, 524, 531, 534
See application file for complete search history.

(56) References Cited

U.S. PATENT DOCUMENTS

| | | | |
|---|---|---|---|
| 3,353,068 A | 11/1967 | Turk | |
| 3,457,866 A | 7/1969 | Komor et al. | |
| 3,457,867 A | 7/1969 | Komor et al. | |
| 3,852,647 A | 12/1974 | Ishii | |
| 4,853,825 A | 8/1989 | Utner | |
| 5,362,679 A | 11/1994 | Wakefield | |
| 5,583,740 A | 12/1996 | Fujino | |
| 6,229,688 B1 | 5/2001 | Kobayashi et al. | |
| 2006/0272150 A1* | 12/2006 | Eguchi et al. ............... 29/841 | |

FOREIGN PATENT DOCUMENTS

| | | |
|---|---|---|
| EP | 0519330 | 12/1992 |
| GB | 960094 | 6/1964 |
| JP | 4329621 | 11/1992 |
| JP | 8069948 | 3/1996 |
| JP | 11254476 | 9/1999 |
| JP | 2001126959 | 5/2001 |

* cited by examiner

*Primary Examiner*—N Drew Richards
*Assistant Examiner*—Kyoung Lee
(74) *Attorney, Agent, or Firm*—Alfred A. Fressola; Ware, Fressola, Van Der Sluys & Adolphson LLP

(57) ABSTRACT

An electric appliance comprises a component part (101) that comprises electronic components, among which is an electrolytic capacitor (105). A molded part (301) is molded around the component part (101), An outer surface of the molded part (301) constitutes at least a part of the outer surface of the electric appliance. The molded part comprises a cavity (302), which contains something else than electronic components or connections between electronic components. The cavity (302) is separated from the electrolytic capacitor (105) by at most a wall the thickness of which is smaller than a mean material thickness of the molded part (301) between the component part (101) and outside of the electric appliance.

13 Claims, 3 Drawing Sheets

PROTECTION OF AN INMOULDED ELECTRIC APPLIANCE AGAINST EXPLOSION

CROSS REFERENCE TO RELATED APPLICATIONS

This application claims priority under 35 USC §119 to Finnish Patent Application No. 20050462 filed on Apr. 29, 2005.

TECHNICAL FIELD

The invention concerns to the assembling and packaging of electric devices. Especially the invention relates to protecting an inmoulded electric appliance against an explosion that might result from the vaporization of part of an electronic component, especially an electrolytic capacitor.

BACKGROUND OF THE INVENTION

FIG. 1 is a partial cross section illustrating an exemplary prior art electric device that comprises a component part 101 and an outer cover, which in this case consists of a lower cover part 102 and an upper cover part 103. Wired connections 104 to and from the electric appliance can be made through holes in the outer cover. We assume that among the components of the component part 101 is an electrolytic capacitor 105.

FIG. 2 illustrates another exemplary prior art device, which is inmoulded. This means that instead of any separately assembled outer cover the electric appliance comprises a moulded part 201, which encloses the component part 101. The moulded part 201 serves several purposes simultaneously. It acts as a mechanical support both to the components of the component part 101 and to possible connections 202, 203 to and from the component part 101. The moulded part 201 also balances temperature differences within the component part 101 by conducting heat away from hot components, and its inner parts constitute electrically isolating walls between the electrically conducting parts of the component part 101. In most cases it also isolates the component part 101 from the environment, keeping out water and dust. The outer surface of the moulded part 201 constitutes the outer surface of the whole electric appliance, which means that it must exhibit sufficient visual quality and give a pleasant tactile feeling. Commonly used materials for the moulded part 201 are thermosetting or thermoplastic hard mouldable polymers.

In addition to inmoulding, also potting or casting of electric appliances is known. As a difference to an inmoulded solution, potting or casting means that the appliance has an outer cover but the space inside it otherwise left free is filled with an epoxy resin or other casting material that flows in to fill all free space and hardens, so that the final result is a solid piece of material in which the space between the inside of the outer cover and the electronic components is filled with the hardened potting material.

A problem of an inmoulded or potted electric appliance is its vulnerability to explosion under certain very improbable but still possible circumstances. If an electrolytic capacitor 105 is subjected to overvoltage or a voltage of incorrect polarity, it may heat up so much that the electrolyte inside thereof begins to vaporize. Electric protection mechanisms such as fuses, overvoltage protection circuits and temperature- or voltage-triggered protective circuit elements are known; also the electrolytic capacitor itself may comprise internal conductor rupturing mechanisms or other means that react to exceptional conditions by electrically disconnecting the capacitor from the rest of the circuitry in the component part. However, the known protective measures may be so slow to react that a significant amount of vaporized electrolyte is still formed, causing a sudden rise of internal pressure within the moulded part. If the pressure difference between the inside and outside of the moulded or potted part becomes sufficiently large, the moulded part may crack.

The vulnerability to explosion of inmoulded or potted electric appliances becomes worse if the appliance should be made as small as possible. For example in the technical field of battery chargers of mobile electric devices there is a trend of squeezing the electronics of the charger device to an increasingly smaller space, so that the main body of a charger might be little larger than the wall plug of a power cord. Small size means thin material thickness of the moulded or potted material between the component part inside it and the outside, which in turn may lead to weaker mechanical strength and consequently to vulnerability to explosion even with relatively moderate pressure differences.

An obvious solution would be to increase the mechanical strength of the material used for the moulded or potted part, for example by mixing some reinforcing substance like glass fibres or carbon fibres to the basic polymer. However, using a reinforcing substance increases material costs and may cause disadvantages in other aspects of the manufacturing process, like increasing the mechanical wear of moulds, causing interference in the flow of the moulding material or producing unwanted visible effects on outer surfaces.

Responsible manufacturers of electric appliances test their products extensively during and immediately after the manufacturing process. Errors like an electrolytic capacitor assembled with incorrect polarity should reveal themselves in these tests. However, it is impossible to make the tests so extensive that they would take into account each and every form of exceptional operational conditions. It is also possible that a testing cycle goes so fast that an electrolytic capacitor with an internal fault does not make it to exploding before the test voltage is removed.

A prior art publication JP 8069948 discloses a protective arrangement in which the moulded cover of a capacitor element comprises a vent, through which the molten metal of a protective fuse may escape. Elastic material that filled the vent under normal circumstances gets pushed outwards by the molten metal and remains as a protective, isolating cover on top of the solidified metal after the protective device has operated. This solution does not solve the problem of expanding gaseous electrolyte. Apparently the author has assumed that the protective fuse is fast enough to cut off the electric current before any pressure buildup occurs. If the electrolyte would vaporize in the solution of JP 8069948, it might blow a way for itself through the vent, spraying the remnants of the elastic material and molten metal from the protective fuse all around.

SUMMARY OF THE INVENTION

An objective of the invention is to provide an inmoulded or potted electric appliance with enhanced safety against cracking or exploding. An objective of the invention is also to ensure that the enhanced safety is readily applicable in many kinds of inmoulded or potted electric appliances. Additionally the invention aims at ensuring ease of manufacture and low additional cost.

The objectives of the invention are achieved by arranging a closed internal cavity to be formed within the moulded or potted part of an inmoulded or potted electric appliance, so that the cavity is either directly next to (i.e. limited by) the electrolytic capacitor or separated therefrom by only a thin wall. In the latter case the thickness of the thin wall should be less than a mean material thickness of the moulded or potted part between the component part and outside of the electric appliance, or it should be otherwise ensured that the thin wall is the first to break if the electrolyte of the electrolytic capacitor starts to vaporize and build pressure.

An electric appliance according to the invention has a component part that comprises electronic components, among which is an electrolytic capacitor. The appliance also comprises a moulded or potted part moulded or potted around the component part. The moulded or potted part comprises a cavity, which contains something else than electronic components or connections between electronic components. The cavity is separated from the electrolytic capacitor by at most a wall the thickness of which is smaller than a mean material thickness of the moulded or potted part between the component part and outside of the electric appliance.

The invention applies also to a method of manufacturing an electric appliance, comprising moulding or potting a moulded or potted part around a component part, thus producing an outer surface of the moulded or potted part, which constitutes at least a part of the outer surface of the electric appliance;

producing a cavity inside said moulded or potted part, making said cavity to contain something else than electronic components or connections between electronic components; and making said cavity to be separated from an electrolytic capacitor in said component part by at most a wall the thickness of which is smaller than a mean material thickness of the moulded or potted part between the component part and outside of the electric appliance.

The invention is based on the insight that actually only a relatively small space is needed to receive the vapour discharging from an overheated electrolytic capacitor. The danger of an explosion is worst if there is no space at all, so that even the smallest amount of pressurized vapour suffices to cause a dangerous amount of pressure. A small space that receives the first attack of discharging vapour will soften the pressure shock and slow down the increase of pressure so that electric protection mechanisms have sufficient time to operate and stop the generation of more vapour. The material of the moulded or potted part must include a deliberately formed cavity next or very near to the electrolytic capacitor, so that the cavity is the easiest and most natural place for the discharging vapour to go to.

Various possibilities exist for deliberately forming a cavity inside the moulding or potting material next to the electrolytic capacitor. The cavity may be empty, meaning that it only contains gaseous substances left therein during the moulding or potting process. This may be accomplished e.g. by using a removable core within the mould or controllably blowing a bubble of air or other gasous substance into the moulding or potting material at a carefully selected moment of the moulding or potting process. Another possibility is to insert a piece of a selected filler material around or next to the electrolytic capacitor before applying the moulding or potting material. The filler part should be hard enough to resist the pressure of the moulding material during the moulding process, but elastic enough to yield if vapour starts discharging from the electrolytic capacitor. Yet another possibility is to make the electrolytic capacitor itself so that only a part of its inside contains the actual capacitive component while another part constitutes a "reserve space" into which vapour may discharge under exceptional conditions.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless othewise ex-plicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

In the following description we will mainly focus on inmoulded solutions, but the same aspects of the invention are readily applicable also to potted electric appliances.

Figure 1:
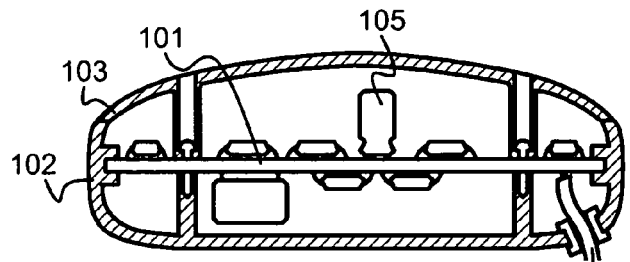
FIG. 1 is a partial cross section of a prior art electric appliance.
Figure 2:
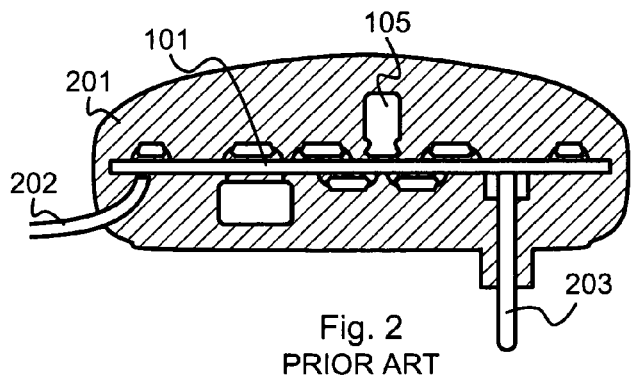
FIG. 2 is a partial cross section of another prior art electric appliance.
Figure 3:
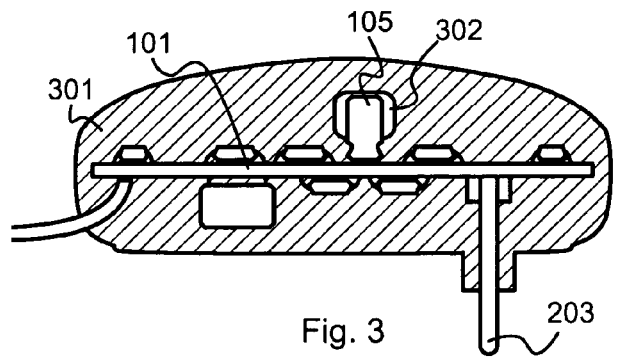
FIG. 3 is a partial cross section of an electric appliance according to an embodiment of the invention.

FIG. 3 illustrates schematically, in partial cross section, an electric appliance which comprises a component part 101 and a moulded part 301. Among the components of the component part 101 there is an electrolytic capacitor 105. The moulded part 301 has been moulded around the component part 101 so that the outer surface of the moulded part 301 constitutes a major part of the outer surface of the whole electric appliance. A part at which the outer surface of the electric appliance comprises something else is for example at the connector pins 203, which enable sticking the electric appliance into a wall socket like a wall plug.

Since the moulded part 301 has been moulded around the component part 101, it naturally contains an internal "cavity" of the size and shape of the component part 101. However, according to an embodiment of the present invention, the moulded part 301 comprises also another internal cavity 302, which is a "true" cavity in the sense that it is empty, i.e. it is not completely filled by any electronic component or a connection between the electronic components of the component part 101. If vapour started to discharge from the electrolytic capacitor 105 shown in FIG. 3, it would flow into the cavity 302 because the cavity 302 immediately surrounds the electrolytic capacitor 105.

The cavity 302 may be empty, which means that is contains some gaseous substance that was left there during the process in which the moulded part 301 was formed. However, since trying to establish an empty cavity inside an otherwise solid moulded part may cause complicatedness in the manufacturing process, it is also possible that the cavity 302 contains some non-gaseous substance that was inserted into the mould to keep the moulded material from reaching all sides of the electrolytic capacitor 105 and that consequently was left there. In order to fulfil the purposes of the invention, such "filler material" must be soft and/or elastic and/or porous enough so that it allows discharging vapour from an overheated electrolytic capacitor to share at least a part of the same volume, for example by collapsing or yielding under the pressure of discharging vapour or absorbing discharging gas to pores of the filler material.

Figure 4:
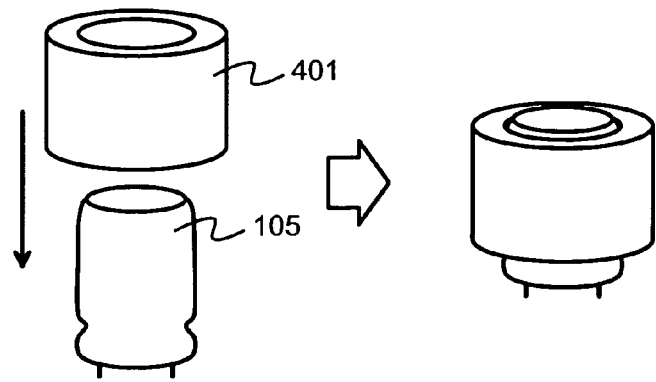
FIG. 4 illustrates an electrolytic capacitor equipped with an elastic sleeve.

FIG. 4 illustrates how an elastic sleeve 401 can be pushed over an electrolytic capacitor 105 before producing a moulded part (not shown) that would otherwise tightly surround the electrolytic capacitor from all sides. Here and in the following description we use the designation "elastic" for brevity, keeping in mind that the material in question does not mandatorily need to be elastic but it can be also soft without elasticity (i.e. easily collapsible under the pressure of discharging gas) and/or porous. Additionally such solid materials can be used that can still stand the temperature of a moulding material but disintegrate at temperatures of discharging gas, or react chemically with the vapours of typical electrolytes by immediately yielding.

Figure 5:
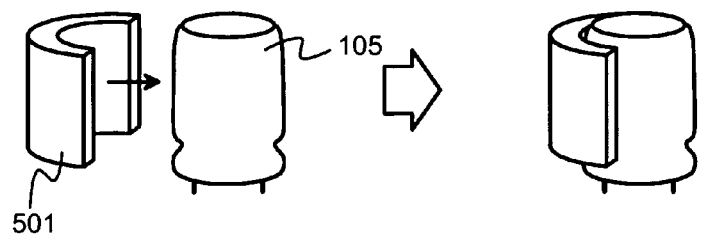
FIG. 5 illustrates an electrolytic capacitor equipped with a partial elastic sleeve.
Figure 6:
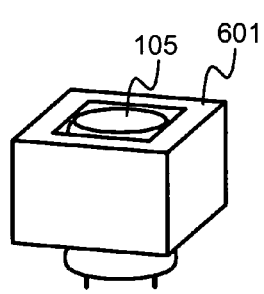
FIG. 6 illustrates an electrolytic capacitor equipped with a differently shape sleeve.

FIG. 5 illustrates a partial elastic sleeve 501 that can be glued or otherwise attached to one side of an electrolytic capacitor 105. FIG. 6 illustrates an elastic sleeve 601 the cross section of which has a different (here square) form than the cross section of the electrolytic capacitor 105, however with suitably matching dimensions so that the inner surface of the elastic sleeve comes into contact with or at least relatively close to the outer surface of the electrolytic capacitor 105 at many locations.

Figure 7:
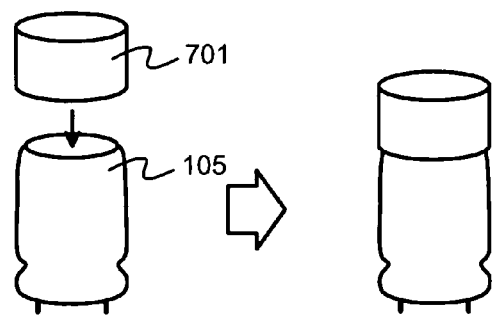
FIG. 7 illustrates an electrolytic capacitor equipped with an elastic extension.
Figure 8:
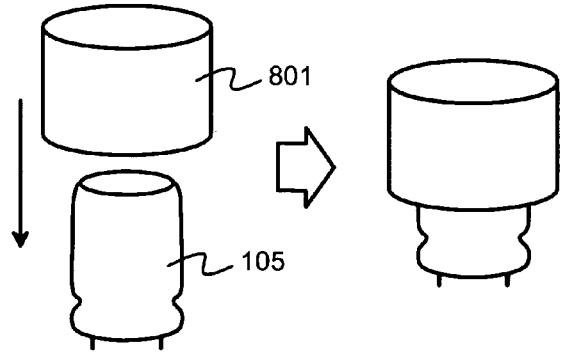
FIG. 8 illustrates an electrolytic capacitor equipped with an elastic.

If the structure of an electrolytic capacitor is such that one side thereof is a highly more probable escape route for discharging gas than other sides, it is advantageous to arrange the vapour-receiving cavity in the moulded part to be formed on that side. FIG. 7 illustrates an electrolytic capacitor 105 the structure of which is such that discharging gas will naturally escape through one end, which in FIG. 7 is the flat end pointing upwards. An elastic extension 701 is therefore glued or ot-herwise attached to said end of the electrolytic capacitor 105, so that in a subsequent moulding step the vapour-receiving cavity will be formed at the correct place (and will contain the elastic extension 701 inside said cavity). FIG. 8 illustrates a solution in which the electrolytic capacitor 105 is equipped with a cup-shaped elastic part 801.

Figure 9:
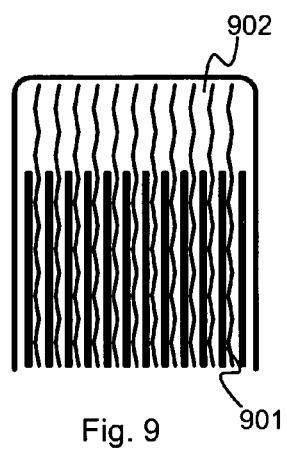
FIG. 9 illustrates an electrolytic capacitor with an inner reserve space.

Basically it is possible to manufacture an electrolytic capacitor so that it contains an inner reserve space that is meant to slow down the buildup of internal pressure in an overheating situation. FIG. 9 illustrates an electrolytic capacitor that contains the actual capacitive component part 901, which has the form of a multi-layered roll where a first electrode foil alternates with a second electrode foil and is separated therefrom by an isolator layer, which is impregnated with the electrolyte. The electrolytic capacitor of FIG. 9 contains also an empty part 902, which in this case contains only loose rounds of the isolator layer.

Figure 10:
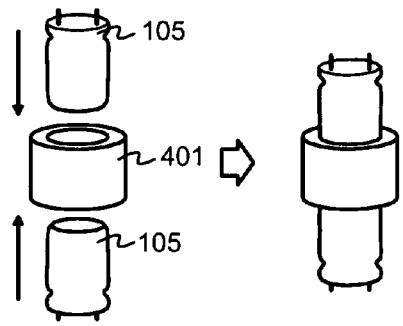
FIG. 10 illustrates equipping two electrolytic capacitors with a common sleeve.

A common elastic sleeve, cap or other piece of auxiliary material can be used to produce a cavity next to two or more electrolytic capacitors. FIG. 10 illustrates a so-called duo tube embodiment of the invention, in which a common elastic sleeve 401 is used for two electrolytic capacitors 105. The passive end (the one with no connection wires) of each electrolytic capacitor 105 is pushed inside the elastic sleeve 401, one from each end of the sleeve. If the sleeve is elastic enough to act as filler material of a cavity, the electrolytic capacitors can be pushed so deep into the sleeve that their passive ends touch each other. If the sleeve is not elastic enough to act as filler material, an empty space is left between the passive ends of the electrolytic capacitors 105.

Figure 11:
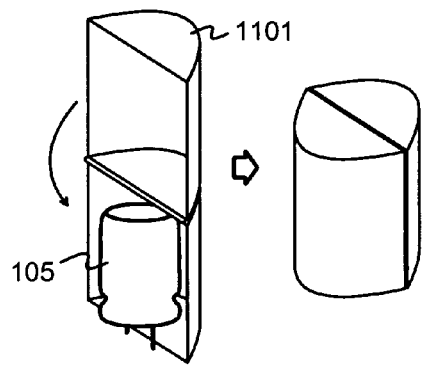
FIG. 11 illustrates enclosing an electrolytic capacitor into a box.
Figure 12:
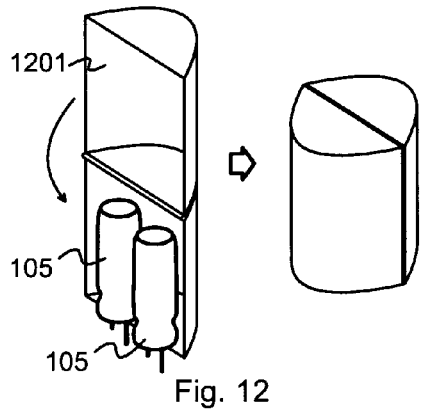
FIG. 12 illustrates enclosing two electrolytic capacitors into a common box.

FIG. 11 illustrates a so-called box embodiment of the invention, in which an electrolytic capacitor 105 is enclosed in a box 1101, the volume of which constitutes the cavity after moulding. FIG. 12 illustrates a so-called duo box embodiment of the invention, in which two or more electrolytic capacitors 105 share a common box 1201. A box like that of FIG. 11 or 12 is most advantageously made of some cheap plastic. Its halves may contain some interlocking formations that help to keep the box closed during the moulding step. The box does not need to be absolutely tight, as long as it keeps the moulding material from completely filling the box during moulding.

Figure 13:
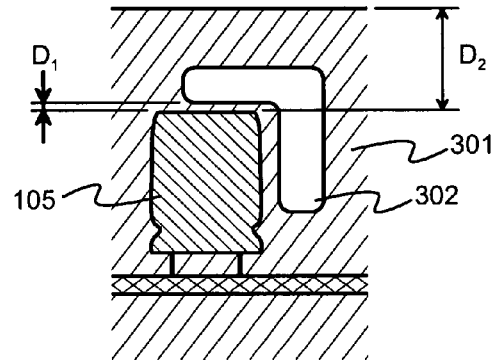
FIG. 13 illustrates the concept of a thin wall in an electric appliance according to an embodiment of the invention.

The invention does not require that the vapour-receiving cavity would be in immediate contact with the outer surface of the electrolytic capacitor. In order to achieve the same effect it may suffice to produce the cavity so that the thickness of a wall separating the cavity from the electrolytic capacitor is small enough. This means that said wall must break, under pressure from the capacitor's side, earlier than any other portion of the moulded part. FIG. 13 is a cross section of a practical example, in which the thickness $D_1$ of the wall separating the cavity 302 from the electrolytic capacitor 105 is smaller than a material thickness $D_2$ of the moulded part 301 between the component part and outside of the electric appliance. In FIG. 13 the place at which the component part reaches closest to the outside of the electric appliance is the top end of the electrolytic capacitor 105. It can be determined by testing, how the comparison distance $D_2$ should be selected; it may be e.g. a mean material thickness of the moulded part between the component part and outside of the electric appliance, or the minimum material thickness of the moulded part between the component part and outside of the electric appliance, or any of these considering only a certain vicinity of the electrolytic capacitor etc.

Not requiring immediate contact with the vapour-receiving cavity and the electrolytic capacitor is a good choice in embodiments of the invention not based on attaching any elastic sleeve or other insert directly to the electrolytic capacitor. For example, an insert may be attached to the circuit board belonging to the component part, or to some other component that is located close to the electrolytic capacitor. Alternatively a movable core can be used in the mould, or some gaseous substance may be blown to the mould to form a bubble inside the moulded part close to the electrolytic capacitor.

Providing an empty space for receiving the discharging vapour is not a replacement for electric protection mechanisms, such as fuses, overvoltage protection circuits and temperature- or voltage-triggered protective circuit elements, because if the exceptional conditions continue to apply, the empty space is soon filled with vapour, which may reach a dangerous pressure if the generation of more vapour is not stopped. Therefore we must assume that each of the electric appliances described above also comprises at least one electric protection mechanism adapted to electrically control the operation of the appliance in a situation where exceptional conditions occur. The empty space provides an additional time marginal during which the electric protection mechanism has time to execute.

Figure 14:
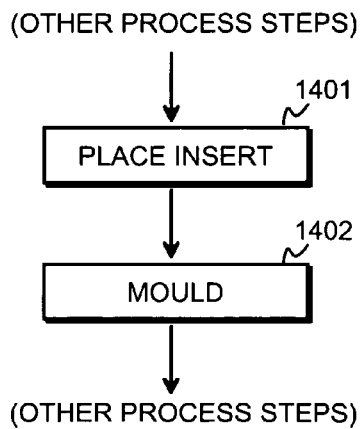
FIG. 14 illustrates a manufacturing method according to an embodiment of the invention and FIG. 15 illustrates a manufacturing method according to another embodiment of the invention.
Figure 15:
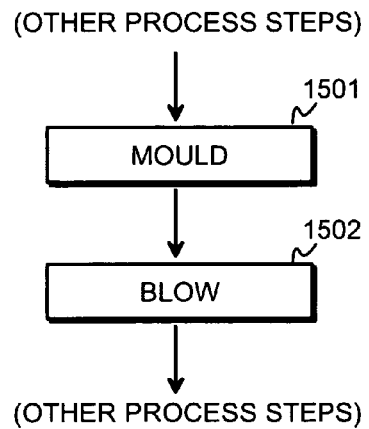

FIGS. 14 and 15 illustrate schematically certain parts of exemplary manufacturing methods according to embodiments of the invention. In the embodiment of FIG. 14 the vapour-receiving cavity is formed by using an insert such as an elastic sleeve or elastic extension. The insert is appropriately placed at step 1401, and the moulded part is subsequently produced by moulding at step 1402. In the embodiment of FIG. 15 the material of the moulded part is injected to the mould at step 1501 and a bubble of a gaseous substance is blown to the mould at step 1502 to form a bubble inside the moulded part close to the electrolytic capacitor.

What is claimed is:

1. An electric appliance, comprising:
    a component part that comprises electronic components, among which is an electrolytic capacitor; and
    a molded or potted part molded or potted around the component part;
    wherein the molded or potted part comprises a cavity, which contains something else than electronic components or connections between electronic components, and which cavity is separated from the electrolytic capacitor by at most a wall the thickness of which is smaller than a mean material thickness of the molded or potted part between the component part and outside of the electric appliance.

2. The electric appliance according to claim 1, wherein the molded or potted part comprises an outer surface, which constitutes at least a part of the outer surface of the electric appliance.

3. The electric appliance according to claim 1, wherein said cavity is empty but for gaseous substances left in said cavity during molding of the molded part.

4. The electric appliance according to claim 1, wherein said cavity comprises a piece of filler material, which is adapted to not exclude discharging vapor from an overheated electrolytic capacitor from flowing to said cavity.

5. The electric appliance according to claim 4, wherein said filler material is elastic.

6. The electric appliance according to claim 3, wherein said filler material is configured to yield under the pressure of discharging vapor from an overheated electrolytic capacitor due to softness of said filler material.

7. The electric appliance according to claim 4, wherein said filler material is configured to absorb discharging vapor from an overheated electrolytic capacitor due to porosity of said filler material.

8. The electric appliance according to claim 1, comprising a box around the electrolytic capacitor, the inside of said box constituting said cavity.

9. The electric appliance according to claim 1, additionally comprising an electric protection mechanism adapted to electrically control the operation of the electric appliance in a situation where exceptional conditions occur.

10. A method for manufacturing an electric appliance, comprising:
    molding a molded part around a component part that comprises electronic components, thus producing an outer surface of the molded part, which constitutes at least a part of the outer surface of the electric appliance;
    producing a cavity inside said molded part, making said cavity to contain something else than electronic components or connections between electronic components; and
    making said cavity to be separated from an electrolytic capacitor in said component part by at most a wall the thickness of which is smaller than a mean material thickness of the molded part between the component part and outside of the electric appliance.

11. The method according to claim 10, comprising placing an insert to a mold before molding the molded part, and subsequently molding the molded part.

12. The method according to claim 10, comprising injecting material of the molded part into a mold and blowing a bubble of a gaseous substance into the mold to form a bubble inside the molded part close to the electrolytic capacitor.

13. A method for manufacturing an electronic appliance, comprising:
    potting a potted part around a component part that comprises electronic components to fill the inside of an outer cover within which the component part is located;
    producing a cavity inside said potted part, making said cavity to contain something else than electronic components or connections between electronic components; and
    making said cavity to be separated from an electrolytic capacitor in said component part by at most a wall the thickness of which is smaller than a mean material thickness of the potted part between the component part and outside of the electric appliance.

* * * * *